United States Patent [19]
Kahn et al.

[11] Patent Number: 5,874,126
[45] Date of Patent: Feb. 23, 1999

[54] MAKING AGGREGATES AND ARTICLES MADE THEREFROM

[75] Inventors: Manfred Kahn, Alexandria, Va.; Mark Chase, Laurel, Md.

[73] Assignee: The United States of America as represented by the Secretary of the Navy, Washington, D.C.

[21] Appl. No.: 826,131

[22] Filed: Mar. 26, 1997

Related U.S. Application Data

[62] Division of Ser. No. 558,313, Nov. 15, 1995.

[51] Int. Cl.$^6$ ............... B05D 5/12; B32B 5/16; H01L 41/04; H04R 17/00
[52] U.S. Cl. ............ 427/100; 428/407; 264/63; 264/43; 252/62.9; 29/25.35; 310/358
[58] Field of Search ............ 264/43, 63; 428/407; 252/62.9; 29/25.35; 310/358; 427/100

[56] References Cited

U.S. PATENT DOCUMENTS

| | | | |
|---|---|---|---|
| 4,707,311 | 11/1987 | Okazaki | 264/43 |
| 4,902,459 | 2/1990 | Matsubara et al. | 264/63 |
| 5,340,510 | 8/1994 | Bowen | 264/62 |

*Primary Examiner*—Cecilia J. Tsang
*Assistant Examiner*—Sandra Marshall
*Attorney, Agent, or Firm*—Thomas E. McDonnell; George A. Kap

[57] ABSTRACT

The process for making a porous mass containing dense aggregates or granules includes the steps of mixing powder with more than 10% by weight of a binder to form agglomerated powder, heating the agglomerated powder to remove the binder and to grow crystallites in the powder to an average diameter exceeding 5 microns to form a porous mass containing the dense aggregates, and cooling the porous mass. The porous mass is broken up, if it is cohesive, into the aggregates containing the crystallites and the aggregates can be used to make an article, such as a transducer. The transducer is essentially a thick film and its thickness is that of the ceramic aggregates of granules. The electrodes connect to the top and to the bottom of the aggragates. As a result, the transducer material operates in the 1–3 mode.

8 Claims, No Drawings

MAKING AGGREGATES AND ARTICLES MADE THEREFROM

This application is a division of application Ser. No. 08/558313. filed Nov. 15, 1995, pending.

FIELD OF THE INVENTION

This invention pertains to the field of particulate materials and articles made therefrom.

BACKGROUND OF THE INVENTION

One prior art process of making an article from a piezoelectric powder includes the steps of mixing the powder with a few weight percent of a binder, often in a liquid solvent, to form a slip; drying the slip to remove the solvent and to form loose powder agglomerates containing dry binder; pressing the agglomerates to form disks composed of powder particles held together by the binder; and heat treating the disks to initially burn out the binder at a lower temperature and then to grow crystallites or crystals at a higher temperature. Porosity of fully heat-treated or sintered disks is usually below 5%.

The disadvantage of this prior art process is that the disks thus formed are difficult to make in large sizes.

SUMMARY OF THE INVENTION

An object of this invention is a particulate raw material and an inexpensive article made therefrom.

Another object of this invention is the use of a great deal more of a binder than taught by the prior art.

Another object of this invention is a process and product, which product has relatively large crystallites and high piezoelectric properties.

Another object of this invention is an article made from aggregates or granules which article has lower density and less weight than a dense ceramic.

These and other objects of this invention are accomplished by mixing powder composed of very small crystallites with in excess of 10% by weight of a binder to form a dried agglomerated powder; heat treating the agglomerated powder to remove the binder and to grow crystallites which are larger in size than the crystallites in the starting powder to form a porous mass containing dense aggregates; and cooling the porous mass. The porous mass is then broken up into the aggregates to facilitate preparation of materials therefrom which can be subsequently used to make an article.

DETAILED DESCRIPTION OF THE INVENTION

The process described herein includes the steps of mixing a powder with more than 10% by weight of a binder, based on the weight of the powder and the binder, wherein the binder is dissolved in a solvent to form a slip or the slip can be formed by mixing a liquid binder and the powder; drying the slip to remove the solvent to form dried, heavily agglomerated powder; heat-treating the dried, agglomerated powder to drive-off the binder and to grow crystallites to form a porous mass containing dense aggregates, which porous mass has a larger particle size and is generally less dense than the initial powder. The slip can be formed by mixing a liquid binder and the powder. Porosity of this product is in excess of about 10% and the size of the crystallites in the product is in excess of 1 micron.

The term "powder" is defined as a loose grouping or aggregation of solid particles, usually smaller than 100 microns, especially smaller than 10 microns. Many of such precursor powders are commercially available and typically have an average particle size of less than about 1 micron. Although any powder can be used herein, preferred here are ceramic powders which, after compaction and sintering, have piezoelectric properties with an average crystallite size of up to about 100 microns.

Examples of the compositions of useful piezoelectric ceramic powders include electrostrictive lead magnesium niobate titanate (PMNT) and piezoelectric lead zirconate titanate (PZT) and barium titanate ($BaTiO_3$). These are usually pre-reacted to form homogeneous and stoichiometric compositions. If an electric field causes a material to have a strain proportional to the square of the field, then such a material is usually characterized as being electrostrictive. If a material develops permanent polarization and deforms more linearly with an applied field (at least with lower applied voltages), the material is piezoelectric. Electrostriction causes material deformation that is independent of the polarity of the applie field. The electrostrictive material lead magnesium niobate titanate has the formula 0.9 $Pb(Mg_{1/3} Nb_{2/3} O_3)$ +0.1 $PbTiO_3$ whereas the piezoelectric material lead zirconate titanate can have the formula $Pb(Zr_{0.52}Ti_{0.48}) O_3$.

In carrying out the process disclosed herein, a prereacted powder is mixed with a binder to form a dispersion. The amount of the binder on a weight basis is in excess of 10%, typically 20–80%, and more typically 40–70%. Suitable binder is any material, typically organic, that is essentially non-reactive with the powder, which can bind the powder particles together and which can be burned out or vaporized at a temperature below about 600° C., typically 100°–500° C. A solid or a liquid binder is suitable which can be dissolved or thinned in a suitable liquid solvent. Suitable solvent is any liquid, typically organic or water, which can dissolve or thin the binder and can be removed or be volatilized at a temperature below about 150° C., typically near or below 100° C. Specific examples of suitable binders are polymeric materials such as polymethyl methacrylate resins, silicone rubbers, epoxy resins, acrylic resins, polyvinyl alcohols and neoprene. Specific examples of suitable solvents include hexane, toluene, ethane, acetone and water.

The dispersion can be formed by mixing the powder with the binder at room temperature or at an elevated temperature. The binder is either dissolved or thinned by either dissolving or mixing the binder beforehand with the solvent and then the resulting binder solution is mixed with the powder. The dispersion formed by mixing a powder with a binder solution is also referred to herein as slip. The slip should have viscosity in the range of 10 to 1000 cps at room temperature in order to readily disperse the powder in the binder. One percent or less, on weight basis, of a dispersant can be added when preparing slip to reduce the propensity for particle agglomeration.

In the preparation of the slip for manufacture of ceramic articles such as transducers, the dispersion or mixing of the binder solution and the powder is typically fully completed in about one hour or less.

After the slip is prepared, it is subjected to a drying step to remove the solvent. The drying step can be carried out by heating the slip to a temperature below about 150° C., often below 100° C., for a period of time necessary to remove all or most of the solvent. Duration of the drying step is dependent on the solvent used and is typically from a fraction of one hour to a couple of days, more typically from one-half hour to 24 hours. The drying step can also be effected by other than conventional heating, such as flash drying and freeze drying, in which case, drying duration can be reduced substantially.

After drying the slip or removal of the solvent, the result is a highly agglomerated dried powder wherein the powder particles in the agglomerates are weakly held together by the binder. After cooling, the agglomerated powder can be broken up into smaller agglomerates, the size of which affects the size of the final aggregates, and loaded into a suitable receptacle for heat treatment. Since the agglomerated powder is weakly held together, it can be broken up by manually crushing it into smaller agglomerates. A suitable receptacle should be non-reactive with the agglomerates that are loaded thereinto and made of a material that can withstand the temperature of the heat treating step. Suitable materials for the heat treating receptacle are alumina ($Al_2O_3$) and zirconia ($ZrO_2$).

The heat treating step is conducted by heating from about room temperature to a temperature range of up to about 1500° C., typically about 300°–1400° C. The heat treating step has two main objectives: to remove or burn-out the binder and to grow and fuse the crystallites. Although the heat treating step can be carried out in two stages to separately accommodate binder removal and crystallite growth, for practical reasons, it is often conducted in one stage where the lower temperature heating is carried out at a slower rate to remove the binder and the higher temperature heating is carried out at a faster rate to minimize lead evaporation and to provide for crystallite growth.

On the basis of the organic binders contemplated herein, the binder will start to vaporize when the powder-binder mix is heated to about 150° C. and will be gone when the atmosphere is oxidizing and a temperature of about 600° C. is reached. Heating to remove the binder should be done slowly at a rate of 5° to 50° C. per hour, typically 10°–30° C. per hour, to avoid cracking in the article made therefrom. In addition, a large volume of air should also be used whereby partial pressure of oxygen in the air exceeds 1% by volume, to prevent charring or deposition of carbon, preferably it should not be in excess of about 10% by volume.

Once the binder is removed from the agglomerated powder, what results are weakly bonded aggregates, composed of crystallites and large pores or voids therebetween. Before sintering, or heat treatment after binder removal, the crystallites in the aggregates are about the same size as in the original powder, meaning that the crystallites have not yet grown. Further heating after binder removal leads to growth of the crystallites. This crystallite growth can be limited, where the crystallites at least double in size, or can be on a larger scale where the crystallites increase in size many times. With respect to a piezoelectric powder, such as PZT powder having a sub-micron initial average crystallite size, the final average crystallite size can be in excess of 5 microns, particularly in the range of 8–20 microns.

The crystallite growth takes place in the sintering temperature range which depends on the initial powder employed. For instance, the sintering temperature range for PZT powder is about 1180° to 1300° C. and for barium titanate it is 1250° to 1380° C. During the crystallite growth stage, the heat treating receptacle should be sealed tightly to prevent loss of lead, if the original powder contains lead as part of its composition.

On the basis of the powders contemplated herein, crystallite growth can commence at about 400° C. and can continue to about 1500° C. When pores between the crystallites are small, as when a small amount of binder is used, diffusion can eliminate the pores, however, when pores are large, as when a large amount of binder is used, diffusion is insufficient to fill the large pores. Heating in the crystallite growth region is typically conducted at a faster rate than in the binder removal region. Heating to cause the crystallites to grow can be conducted typically at a rate of 50°–500° C. per hour, more typically 80°–300° C. per hour. What results after the heat treating step is an easily broken up porous mass.

Such a porous mass is then cooled to nearly room temperature at a rate typically corresponding to that of heating. The cooling step is typically conducted at a rate of 50°–500° C. per hour, more typically 80°–300° C. per hour. What results is a porous mass product containing dense aggregates with the latter having a density of up to about 8 g/cc, but more typically about 6–6.5 g/cc. The product is often in a coherent mass which can be broken up by mild impact to form the aggregates. These aggregates can be screened and used to form an article.

The material prepared as described herein has larger aggregates and as great a piezoelectric activity a the prior art material. The last noted advantage applies to a material that has a piezoelectric property.

Another advantage can be realized by the material prepared as described herein if a very large amount of binder is used. If the amount of binder that is used to mix with the powder, especially PZT powder, exceeds about 60% by weight, the product attains the form of aggregates or granules, about 100–200 microns in size individually, having porosity below 10%, typically 4–7%. This is an important advantage since the impact and screening steps may be dispensed with and the granules can be used to make an article, such as a 0–3 composite transducer, where the larger size of the granules compared to the powder particles in the disks or crushed disks results in a 0–3 mode transducer that is less dense and has a greater piezoelectric activity, assuming that a piezoelectric powder was used initially.

Another advantage that can be realized by using the process disclosed herein relates to relief of stress in crystallites. Relief of stress in crystallites can lead to improved piezoelectric performance in an article made from the granules. This embodiment presupposes the use of a powder which has highly anisotropic crystallites. This anisotropy arises during cooling. If such a powder is sintered into a dense mass, the appearance of such an anisotropy causes considerable stresses in such a mass, to the point of it cracking and falling apart. Very few of such stresses arise in a small granule, especially when it has low density. As a result, 0–3 composite transducers made from such granules will have improved piezoelectric performance over one made from stressed material.

The granules prepared in accordance with the invention disclosed herein, can be used to make an article, particularly an electronic article, and more particularly a transducer. A 0–3 transducer can be made from a polymer matrix and from inclusions of the ceramic granules distributed within the matrix. Based on the combined weight of the polymer matrix and the ceramic granules, amount of the ceramic granules in such transducers varies from 10% to 50% by weight. This, of course, means that amount of the polymer in such transducers is 90–50% by weight. In such 0–3 transducers, connectivity of the granules is zero and connectivity of the polymer is three in the x, y and z planes. In 1–3 transducers, piezoelectric rods extend between electrodes with a polymer resin disposed between the rods. In 1–3 mode, 0–3 transducers as discussed here, the ceramic granules are typically greater than about 100 microns, more typically about 100–200 microns. The granules are simultaneously in contact with both top and bottom electrodes and with the polymer surrounding the granules. In 1–3 transducers, connectivity of the ceramic granules is 1 and connectivity of the polymer is 3.

Transducers containing the ceramic granules disposed between the electrodes and parallel to the poling direction, are generally made by mixing a polymer with the ceramic granules and forming a typically rectangular form with thickness typically of 50 to 500 microns, more typically 100 to 250 microns. Suitable polymers are epoxy resins, polyurethane resins, acrylic resins, silicone rubbers, and neoprene. Electrodes are provided on opposite surfaces of the form, as by painting a suitable metal paint, such as a silver paint, or by sputtering thereon a metal, such as silver. Electrodes can be 10–100 microns in thickness.

Prior art 0–3 transducers of this type made from lead titanate obtained by breaking up sintered disks have a piezoelectric activity or $d_{33}$ of about 35–60 pC/N whereas 0–3 transducers made with the ceramic granules and operating in the 1–3 mode are expected to have $d_{33}$ of about 65–100 pC/N, which is a significant improvement. Furthermore, since the dielectric constant of a material is affected by its density, reduced density of the articles made with the new material will reduce its dielectric constant. This is beneficial in the sensing mode.

The invention having been generally described, the following examples are given as particular embodiments of the invention to demonstrate the practice and advatanges thereof. It is understood that the examples are given by way of illustration and are not intended to limit in any manner the specification or any claims that follow.

EXAMPLE 1

This example demonstrates preparation of granules about 100–200 microns in size from a piezoelectric ceramic powder.

Pursuant to the disclosure herein, a binder solution was prepared by dissolving 40 grams of solid polyvinyl alcohol binder in 400 ml of water solvent at 75° C. and 5 drops of Tamol® dispersant. The binder solution was prepared by stirring for 1 hour the ingredients on a hot plate. After the binder solution was prepared, it was mixed with 20 grams of PZT-5H powder having average particle diameter of 0.8 microns to form a slip which contained 67% binder, on dry weight basis. The slip in a beaker was dried by heating the beaker on a hot plate to about 100° C. and leaving overnight to drive-off water. After the slip was dried, what resulted was a highly agglomerated dried powder wherein the agglomerates were weakly held together, if at all.

The highly agglomerated dried powder was manually broken-up, loaded into a zirconia ($ZrO_2$) boat receptacle and moved into a burnout furnace. Removal or burn-out of the binder took place in the furnace which was heated from room temperature to about 600° C. at a slow rate of slightly over 10° C. per hour with air flowing through the furnace at a rate sufficient to prevent charring. Volatilization of the binder commenced at about 150° C. and all of the binder was gone when a temperature of about 500° C. was reached.

The boat was then removed from the furnace and cooled to room temperature. What was in the boat was a highly porous mass containing crystals that were about the same size as the crystals in the powder and large pores between the crystals. The matrix was weak and could be easily crushed manually.

The boat was removed from the burnout furnace and cooled. It was then sealed tightly with a zirconia plate to prevent loss of lead and loaded into a sintering furnace where the boat and its contents were heated from room temperature to 1280° C. with a soak of one hour at 1280° C. Since the binder was removed at a temperature of below 600° C., the sintering furnace was quickly heated to about 500° C. and then at a rate of 3° C. per minute until 1280° C. was reached. During sintering, crystals grew in size and the product became more dense. Following sintering, the boat was allowed to cool at a rate of about 100° C. per hour to room temperature.

The final product was a porous mass in the form of dense aggregates or granules as large as 800 microns in size containing crystals of about 10 microns in size. Its porosity was about 15%.

EXAMPLE 2

This example demonstrates preparation of an article from the granules similar to those of Ex. 1, above.

The granules used in this example have average diameter of 200 microns and their density is 6.3 g/cc.

A casting mold is used that consists of a wide groove, which groove is rectangular in cross-section, 200 microns deep, 2 centimeters wide and 10 centimeters long. A dispersion is prepared by mixing the granules with liquid methyl methacrylate binder. The dispersion consists of, on weight basis, 25% granules and 75% binder.

The groove in the casting mold is filled with the dispersion and levelled. The methyl methacrylate binder in the groove is cured by maintaining the casting mold at room temperature for about 24 hours to solidify the composition in the groove. After the solidified composition that takes the shape of the groove is removed from the groove, its two major surfaces are painted with a room temperature curing silver paint and the paint is allowed to dry in 5–10 minutes in the room environment. The thickness of the electrodes, i.e., the dried silver layer, is about 3 microns. The result is a pressure sensitive film that can be used as a large area pressure sensor with $d_{33}$ of about 400 pC/N and $d_h$ above 65 pC/N.

Many modifications and variations of the present invention are possible in light of the above teachings. It is, therefore, to be understood that within the scope of the appended claims, the invention may be practiced otherwise than as specifically described.

What is claimed is:

1. A process for preparing aggregates or granules comprising the steps of:

(a) mixing a particulate crystalline material having average particle diameter below 100 microns with a binder in an amount exceeding 10% by weight, based on the dry weight of the material and the binder, to form a dispersion of particulate material dispersed in the binder;

(b) heating the dispersion to a temperature of up to about 1500° C. to remove the binder and to grow the crystallites in the particulate crystalline material to form a porous mass containing the granules; and (c) cooling the porous mass.

2. Process of claim 1 including a liquid solvent that is used to dissolve the binder to form a binder solution, amount of the binder in the dispersion being 30–80% based on the combined weight of the binder and the particulate material.

3. Process of claim 2 including the step of removing the solvent from the dispersion to form an agglomerated material before the crystallite growth.

4. The process of claim 3 wherein the step of removing the solvent is accomplished by heating and thus drying the dispersion at a temperature below about 150° C. for the duration necessary to remove all or part of the solvent.

5. The process of claim 4 wherein the particulate crystalline material is a ceramic piezoelectric powder having average particle diameter in the range of up to 10 microns, the temperature for removal of the solvent is below about 100° C. and the heating step is conducted by heating to a temperature in the range of about 300°–1400° C.

6. The process of claim 5 wherein said heating step is carried out initially at a rate of about 5°–50° C. per hour in presence of sufficient oxygen to avoid charring to remove the binder and then at a rate of about 50°–500° C. per hour to allow for crystallite growth whereby the average crystallite diameter at least doubles compared to the average crystallite diameter in the starting powder, the crystallite growth taking place in the heating step after binder removal.

7. The process of claim 6 wherein the amount of the binder in the dispersion is in excess of about 60%, based on the weight of the powder and the binder, and the resulting porous mass contains granules about 100–200 microns in average size.

8. The process of claim 7 wherein the powder has average particle diameter of below about 1 micron; the powder is selected from the group consisting of lead zirconate titanate, barium titanate, and mixtures thereof; the binder is vinyl alcohol; the solvent is water; and the average diameter of the grown crystallites is 8–20 microns.

* * * * *